United States Patent
Chang

(10) Patent No.: US 7,303,786 B2
(45) Date of Patent: Dec. 4, 2007

(54) METHOD OF FORMING A POLYSILICON LAYER

(75) Inventor: Mao-Yi Chang, Taipei (TW)

(73) Assignee: AU Optronics Corp., Hsinchu (TW)

( * ) Notice: Subject to any disclaimer, the term of this patent is extended or adjusted under 35 U.S.C. 154(b) by 841 days.

(21) Appl. No.: 10/754,406

(22) Filed: Jan. 9, 2004

(65) Prior Publication Data

US 2005/0003639 A1  Jan. 6, 2005

(30) Foreign Application Priority Data

Jul. 1, 2003  (TW) .............................. 92118019 A

(51) Int. Cl.
*B05D 3/02* (2006.01)
*B05D 3/06* (2006.01)

(52) U.S. Cl. .............................. 427/397.7; 427/419.2; 427/419.7; 427/554

(58) Field of Classification Search ...................... None

See application file for complete search history.

(56) References Cited

U.S. PATENT DOCUMENTS 5,707,888 A * 1/1998 Aronowitz et al. ......... 438/440

OTHER PUBLICATIONS

Derwent Abstract for KR 2001097926 A.*

* cited by examiner

*Primary Examiner*—William Phillip Fletcher, III
(74) *Attorney, Agent, or Firm*—Thomas, Kayden, Horstemeyer & Risley

(57) ABSTRACT

In a method of forming a polysilicon layer on a substrate, a first embodiment comprises: doping inert gas into the substrate to form a plurality of pores in the substrate; depositing a buffer later on the substrate; depositing an amorphous silicon layer on the buffer layer; and heating the amorphous silicon layer to convert the amorphous silicon layer into a polysilicon layer. A second embodiment comprises: depositing a first buffer layer on a substrate; doping inert gas into the first buffer layer to form a plurality of pores in the first buffer layer; depositing a second buffer layer on the first buffer layer; depositing an amorphous silicon layer on the second buffer layer; and heating the amorphous silicon layer to convert the amorphous silicon layer into a polysilicon layer.

30 Claims, 7 Drawing Sheets

METHOD OF FORMING A POLYSILICON LAYER

This application claims the benefit of Taiwan application Serial No. 92118019, filed Jul. 1, 2003.

BACKGROUND OF THE INVENTION

1. Field of the Invention

The invention relates in general to a method of forming a polysilicon layer on a substrate, and more particularly to a method of forming a polysilicon layer with larger grain size on a substrate.

2. Description of the Related Art

On the substrate of thin film transistor liquid crystal display (TFT-LCD), there are a number of TFT Arrays, which function to control the arrangement of the liquid crystal of each pixel. The thin film transistor is mainly made of amorphous silicon or polysilicon. The polysilicon is superior to the amorphous silicon in its higher electron mobility. This favorable characteristic enables the polysilicon to integrate higher number of circuit. The complexity and weight of the product are therefore decreased. Thus, the polysilicon technology becomes a main stream in the field of TFT-LCD development and the task of increasing electron mobility of polysilicon is now a priority issue for researchers.

FIGS. 1A to 1D illustrate a conventional method of forming a polysilicon layer on a substrate. First, referring to FIG. 1A, a buffer layer such as a silicon dioxide layer 120 is first deposited on the substrate 110 by the technique of plasma enhanced chemical vapor deposition, PECVD. Next, referring to FIG. 1B, an amorphous silicon layer 130 is deposited on the silicon dioxide layer 120 by the same technique, PECVD. Amorphous silicon is precursor of polysilicon. Finally, referring to FIG. 1C, a laser beam 140 is emitted onto the amorphous silicon layer 130. Laser beam 140 serves as a thermal resource to heat and convert amorphous silicon 130 into polysilicon layer 150 as shown in FIG. 1D Referring to FIG. 1C, The laser beam with a wavelength of 308 nm combined with ELA technique is used to crystallize the amorphous silicon layer on the substrate 110; Thus, the amorphous silicon layer 130 is transformed to the polysilicon layer 150 as shown in FIG. 1D. The buffer layer, such as the silicon dioxide layer 120, serves as a heat insulator between the substrate 110 and the amorphous silicon layer 130. With the benefit of the buffer layer, the temperature of the substrate 110 will not exceed 250° C. even though the temperature of the amorphous silicon layer 130 approaches 1500° C. during the ELA process. Moreover, the substrate 110 would not be deformed because the rapid heating process, which takes merely about several hundred microseconds.

The substrate mentioned above can be a glass substrate. The method of forming a polysilicon layer on a substrate can be applied to a TFT-LCD manufacturing process. The buffer layer is either a silicon dioxide ($SiO_2$) layer or a silicon nitride ($Si_3N_4$) layer.

In the conventional method of forming a polysilicon layer on a substrate, the high speed of heat conduction attributes to the high thermal conductivity (TC) of the substrate 110 as well as the buffer layer. Accordingly, the thermal energy of the melted amorphous silicon (liquid silicon) dissipates rapidly through the substrate 110 and the silicon dioxide layer 120, which limits the duration of crystallization and consequentially influences the grain size of the polysilicon. The grain size of the polysilicon layer 150 directly ruins the performance of the thin film transistor, such as lower electron mobility.

In conclusion, the electron mobility of the TFT arrays can not be increased efficiently according to the conventional method of forming a polysilicon layer in a substrate. The reason is that only the polysilicon with smaller grain size instead of larger grain size can be obtained by means of the conventional method.

SUMMARY OF THE INVENTION

It is therefore an object of the invention to provide a method of forming a polysilicon layer in a substrate. The method can achieve the goals of converting the amorphous silicon layer into the polysilicon layer, forming larger grain size, and raising the electron mobility of the TFT arrays.

The invention achieves the above-identified objects by providing a method of forming a polysilicon layer on a substrate. The method includes: first, the inert gas is first doped into the substrate to form a number of pores in the substrate. A buffer layer is then deposited on the substrate. Next, an amorphous silicon layer is doped over the buffer layer. Finally, the amorphous silicon layer is heated and then being converted into a polysilicon layer.

The invention achieves the same above-identified objects by providing the other method of forming a polysilicon layer in a substrate. The method includes: first, a first buffer layer is deposited on a substrate. An inert gas is then doped into the first buffer layer to form a number of pores in the first buffer layer. Next, a second buffer layer is deposited on the first buffer layer. Further, an amorphous silicon layer is deposited on the second buffer layer. Finally, the amorphous silicon layer is heated to convert the amorphous silicon layer into a polysilicon layer.

The substrates mentioned above could be glass substrates. Further, the two methods are applied to the TFT-LCD manufacturing process. The inert gas could be argon. The buffer layer, the first buffer layer, and the second buffer layer could be a silicon dioxide layer as well as a silicon nitride layer. In the step of heating the amorphous silicon layer, a laser beam is used and an excimer laser annealing (ELA) technique is applied to heat and convert the amorphous silicon layer to the polysilicon layer.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
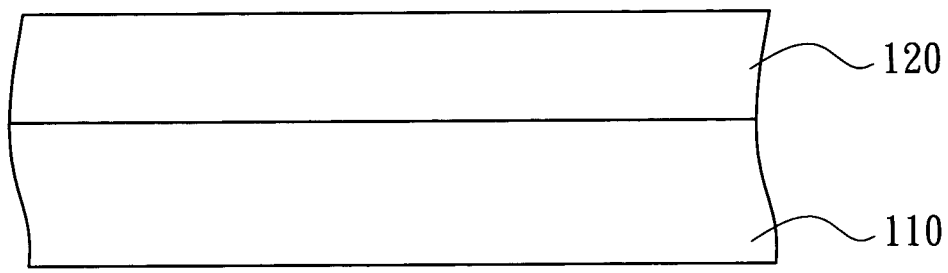
FIGS. 1A to 1D (Prior Art) are cross-sectional views showing a conventional process of forming a polysilicon layer on a substrate.
Figure 1B:
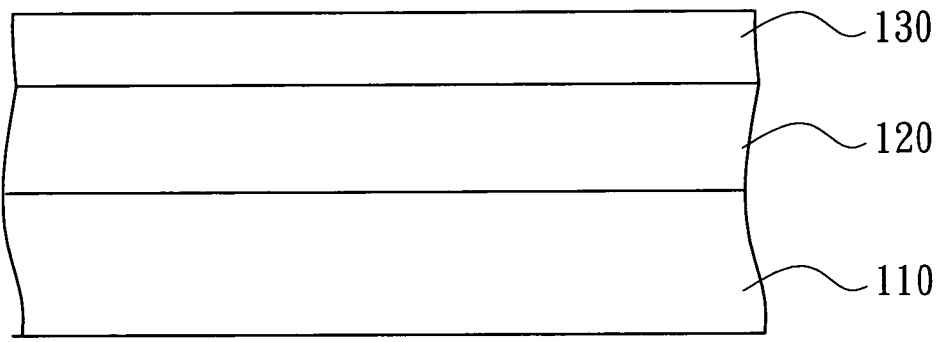
Figure 1C:
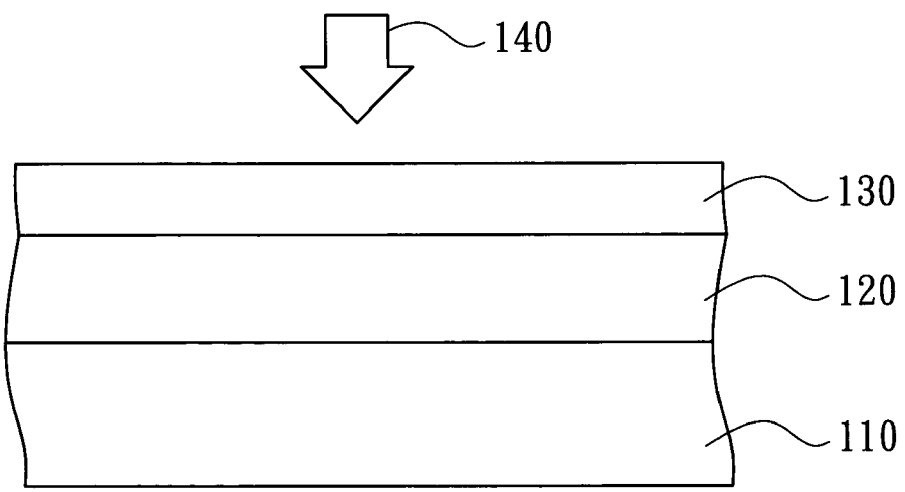
Figure 1D:
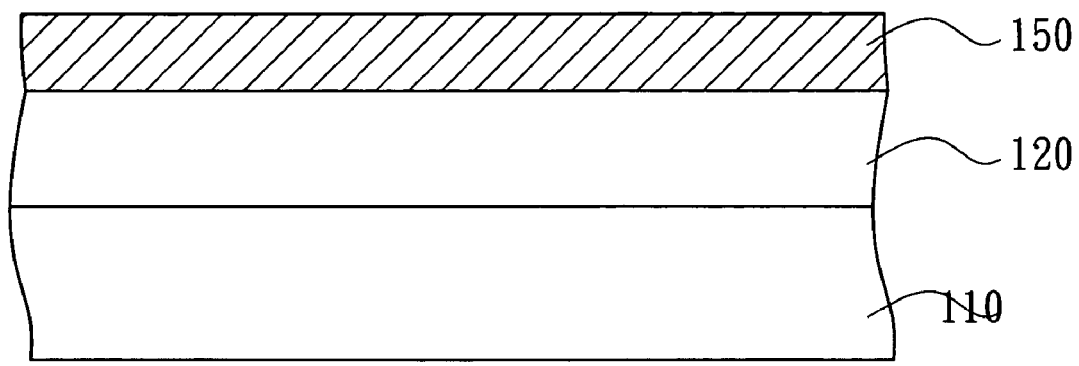
Figure 2A:
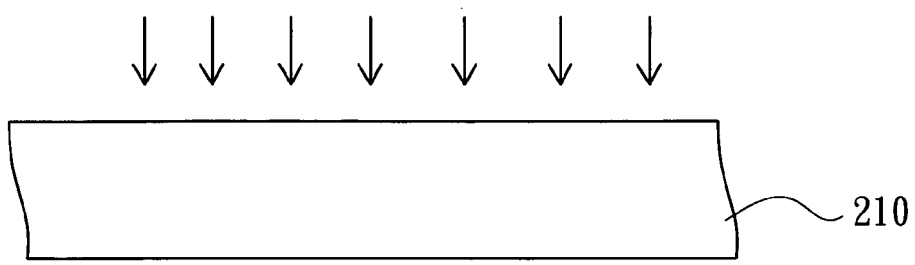
FIGS. 2A to 2E are cross-sectional views showing the process of forming a polysilicon layer on a substrate according to a preferred embodiment of the invention.
Figure 2B:
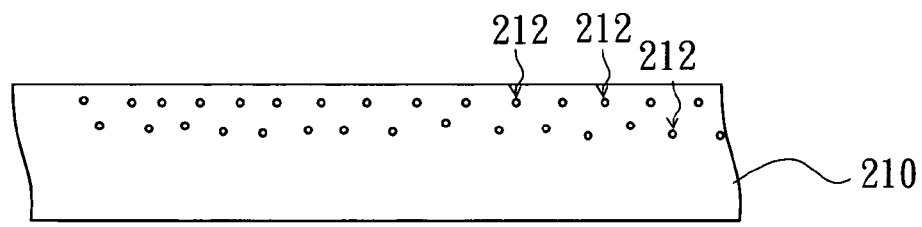
Figure 2C:
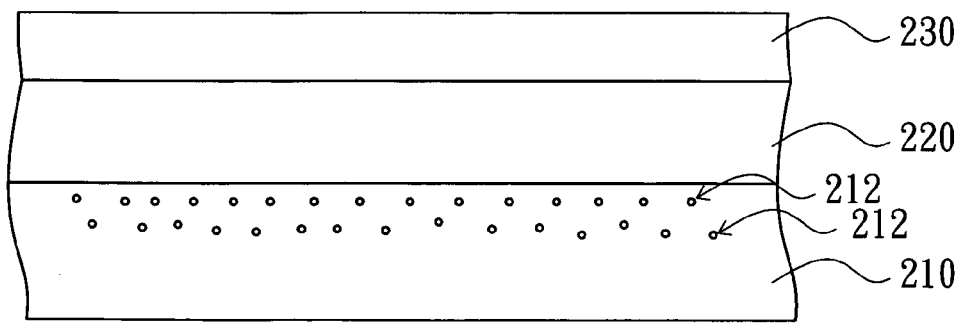
Figure 2D:
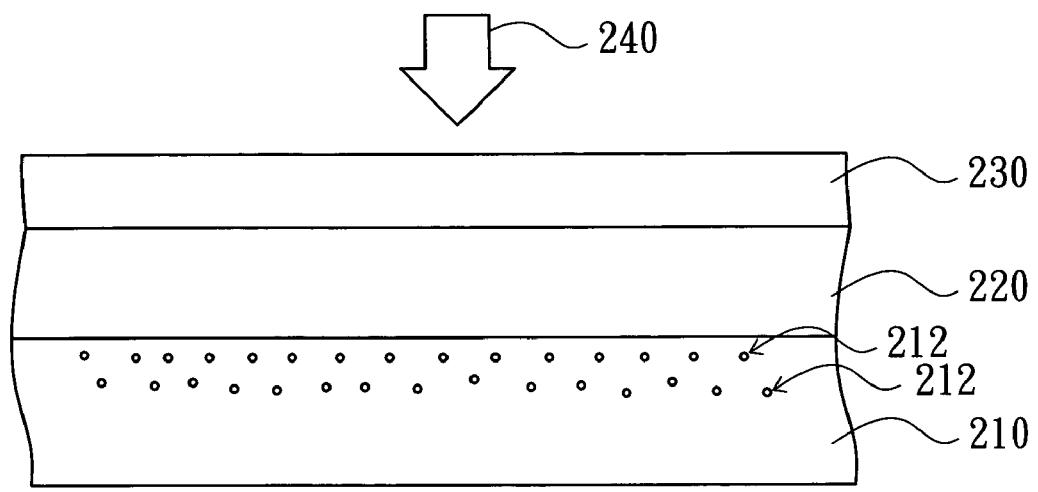
Figure 2E:
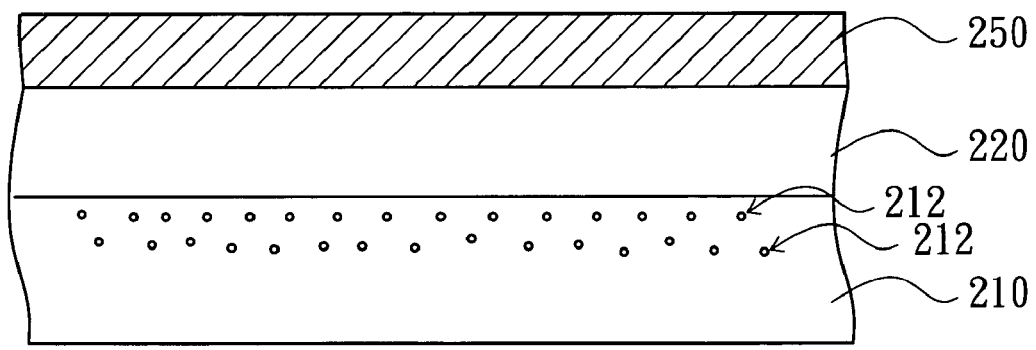

FIGS. 2A to 2E are cross-sectional views showing the process of forming a polysilicon layer on a substrate according to a preferred embodiment of the invention. The method of forming the polysilicon layer is described through the following steps. Referring first to FIG. 2A, an inert gas, such as argon (Ar), is doped into the substrate 210 along the direction shown in the drawing to form a number of pores 212 in the substrate 210 as shown in FIG. 2B. Next, referring to FIG. 2C, in the same reactor, a buffer layer such as the silicon dioxide layer 220 is formed on the substrate 210 and thereafter an amorphous silicon layer 230 is formed on the silicon dioxide layer 220 with the utilization of the plasma enhanced chemical vapor deposition (PECVD) technique. The amorphous silicon is regarded as precursor of polysilicon. Finally, referring to FIG. 2D, the laser beam 240 is emitted onto the amorphous silicon layer 230 based on the excimer laser annealing technique. The laser beam 240 functions as the heat resource to provide thermal energy for the amorphous silicon layer 230 so that the amorphous silicon is converted into polysilicon and a polysilicon layer 250 shown in FIG. 2E is formed.

The polysilicon layer 250 can be formed on the substrate 210 by the above mentioned steps. However, it is not limited thereof. An alternative method is described as follows.

Figure 3A:
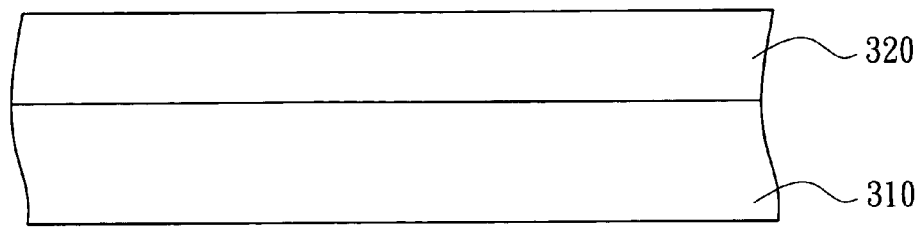
FIGS. 3A to 3F are cross-sectional views showing the alternative process according to the preferred embodiment of the invention for forming a polysilicon layer on a substrate.
Figure 3B:
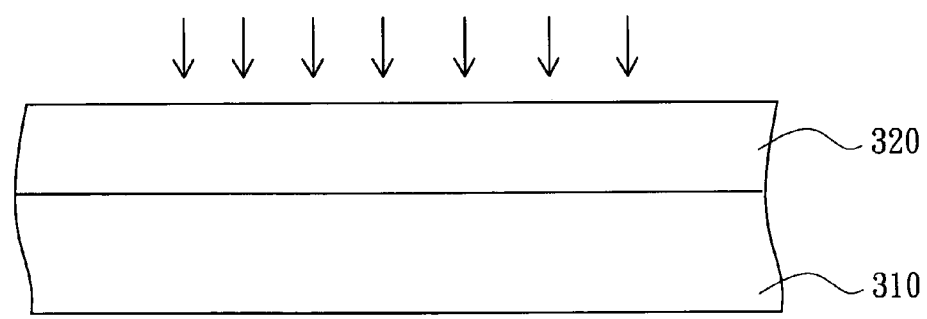
Figure 3C:
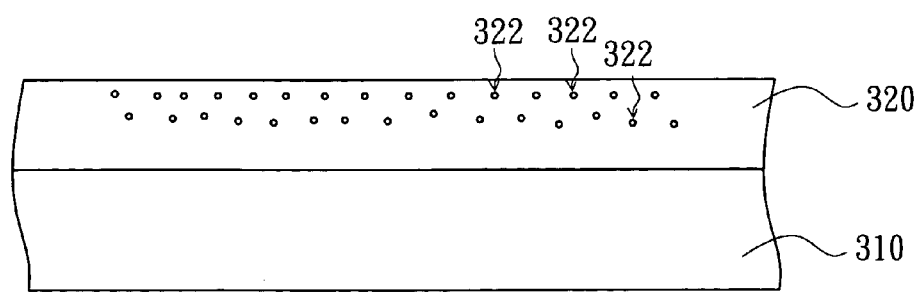
Figure 3D:
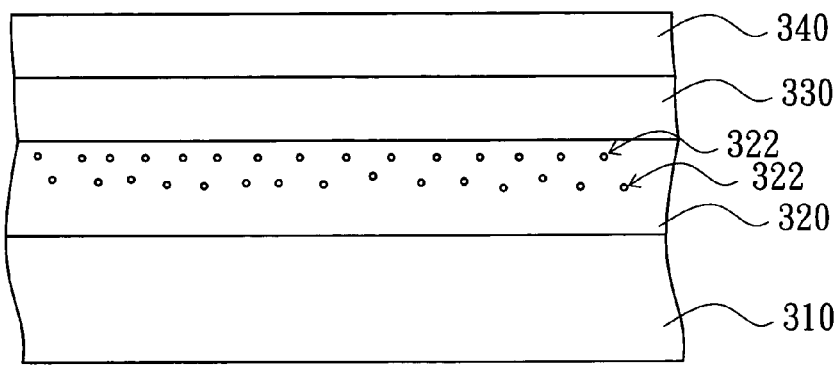

FIG. 3A to 3F are cross-sectional views showing the alternative process according to the preferred embodiment of the invention for forming a polysilicon layer on a substrate. First, referring to FIG. 3A, a buffer layer such as a silicon dioxide layer 320 is deposited on the substrate 310 by using the technique of PECVD in a reactor. Next, referring to FIG. 3B, an inert gas, such as Ar, is doped into the first buffer layer 320 along the direction shown in the drawing to form a number of pores 322please amend the same in the first buffer layer 320 as shown in FIG. 3C. Afterwards, referring to FIG. 3D, the same reactor and PECVD technique are employed to deposit a second buffer layer 220, such as a silicon dioxide layer, on the first buffer layer 320. The second buffer layer 220 is preferred to be thinner than the first buffer layer 320. The amorphous silicon layer 340 is deposited on the second buffer layer 330. The same as the prior process, the amorphous silicon is the precursor of the polysilicon and can be heated to be converted as polysilicon.

Figure 3E:
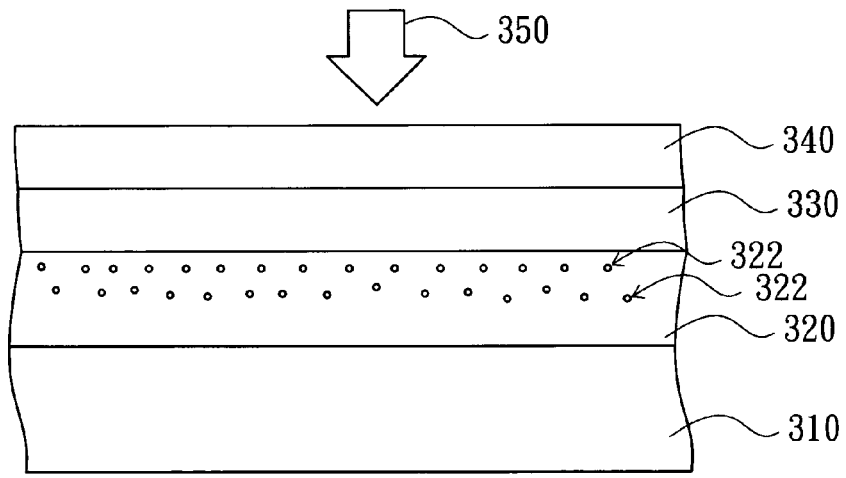
Figure 3F:
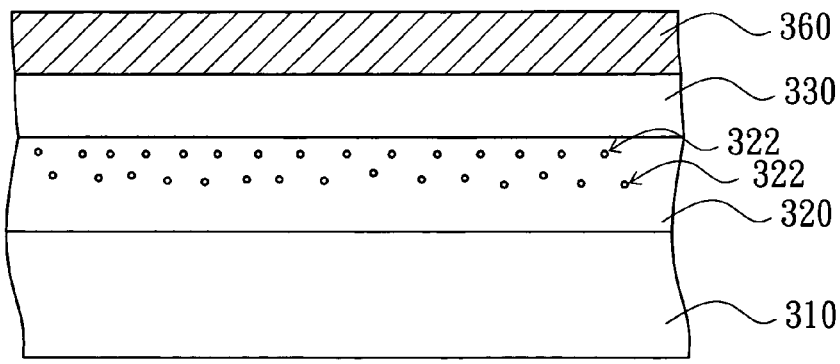

Finally, ELA technique is applied. Referring to FIG. 3E, the laser beam 350 functions as the heat resource to provide thermal energy for the amorphous silicon layer 340 so that the amorphous silicon is converted into polysilicon and a polysilicon layer 360 shown in FIG. 3F is formed. By the similar technique, a polysilicon layer 360 for fabricating TFT arrays can be formed on the substrate 310.

In the two embodiments mentioned above, glass substrate is an alternative to the substrate 210 and the substrate 310. In addition, these two methods can both be applied in the TFT-LCD manufacturing process. The inert gas can be argon. The buffer layers, the first buffer layer 320 and the second buffer layer 330 can be either a silicon dioxide layer or a silicon nitride layer.

In the previous two embodiments, argon is doped into the substrate 210 and the first buffer layer 320 so that a number of pores are formed in the substrate 210 as well as the first buffer layer 320. As a result of the pores, the substrate 210 and the first buffer layer 320 have smaller thermal conductivities than other part of the same substrates. Both of these two embodiments of the invention can decrease the thermal conductivity of the substrates and the buffer layers. Thus, the durations of crystallization as well as the growing time for silicon grain are both extended, which consequently cause the formation of polysilicon of larger grains size.

The difference between these two embodiments is merely that the inert gas, such as argon, is doped into the substrate 210 in the first embodiment whereas the inert gas is doped into the first buffer layer 320 in the second embodiment. The process of doping inert gas results in the formation of plenty of pores 212 and 322 in the substrate 210 and the first buffer layer 320. The purpose of implanting neutral inert gas is to prevent the changing of the TFT characteristic, which could be caused by doping dopants able to be ionized In the second embodiment, after the process of implanting argon, the pores 322 in the first buffer layer 320 result in a great number of nucleation sites, which limits the growth of the polysilicon grain sizes. The solution is to deposit the second buffer layer 330, which has no pore and serves as the base of the amorphous silicon layer 340, over the first buffer layer 320.

Each of these two embodiments has its distinct advantages. The manufacturing process according to the second embodiment requires to be operated in the reactor twice, whereas the manufacturing process according to the first embodiment requires to be operated in the reactor only once. In terms of the uniformity of the grains of the polysilicon, the grain size of the polysilicon formed according to second preferred embodiment has superior uniformity.

Figure 4:
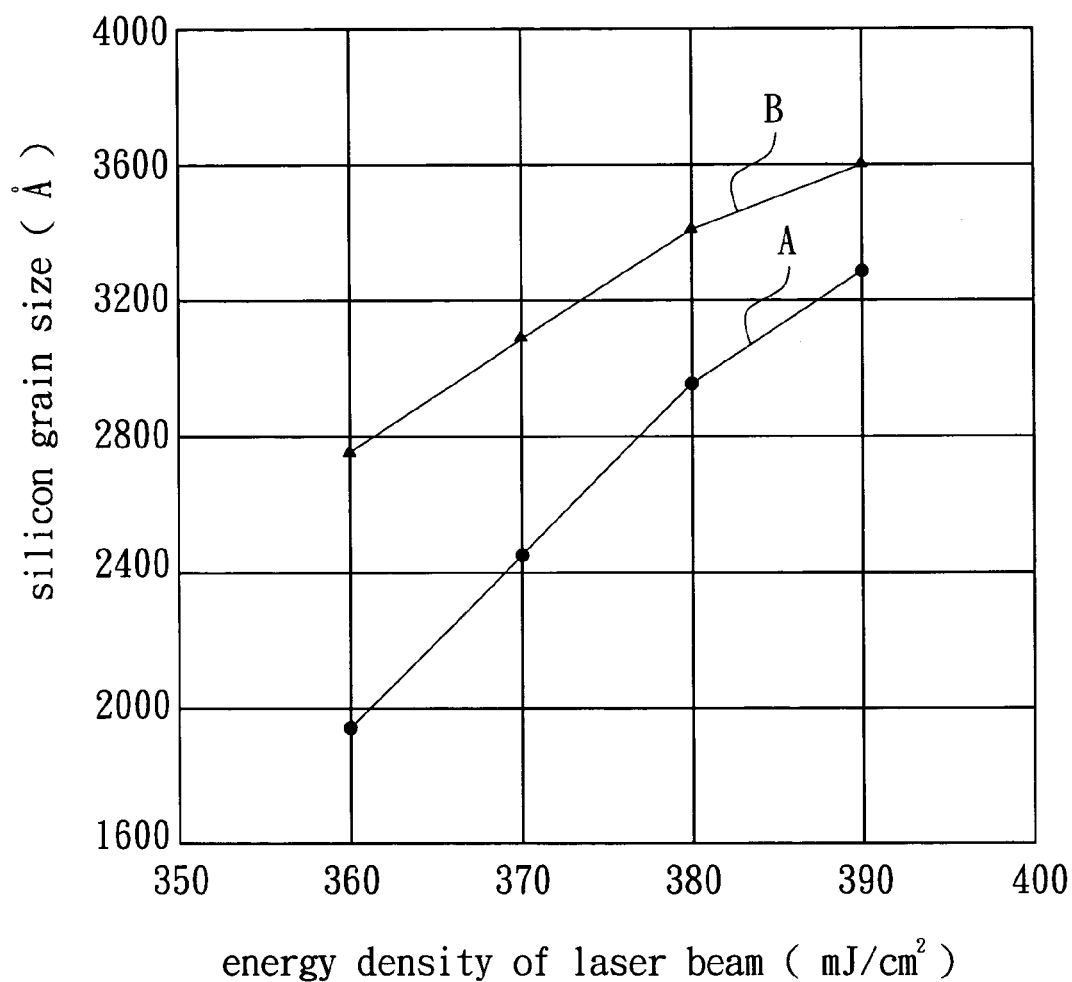
FIG. 4 is a schematic diagram showing the relative uniformity of silicon grain size between the method of the invention and the prior art.

FIG. 4 is a schematic diagram showing the relative uniformity of silicon grain size between the method of the invention and the prior art. The energy density (denoted as x-coordinate in FIG. 4) of the laser beam emitted onto the amorphous silicon may not be constantly stable during the formation of polysilicon layer, which could consequentially cause the shifting of grains size in the polysilicon layer (denoted as y-coordinate in FIG. 4). The relationship between the silicon grain size and the energy density of laser beam is shown by curve A and curve B, wherein curve A derives from the method of the invention and curve B derives from the conventional method. From FIG. 4, it is apparent that the invention provides silicon with larger grain size as well as higher uniformity because the porous substrate and buffer layer has lower thermal conductivity.

To sum up, the invention, a method of forming a polysilicon layer on a substrate, disclosed in the previous embodiments includes the following advantages: not only the greater silicon grain size but also the better grain uniformity. As a result, the electron mobility of the TFT arrays is increased efficiently.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a polysilicon layer on a substrate, comprising the steps of:
    doping inert gas into the substrate to form a plurality of pores in the substrate;
    depositing a buffer layer on the substrate;
    depositing an amorphous silicon layer on the buffer layer; and
    heating the amorphous silicon layer to convert the amorphous silicon layer into a polysilicon layer.

2. The method according to claim 1, wherein the substrate is a glass substrate.

3. The method according to claim 1, wherein the method is applied to a thin film transistor liquid crystal display (TFT-LCD) manufacturing process.

4. The method according to claim 1, wherein the inert gas is argon, Ar.

5. The method according to claim 1, wherein the buffer layer is a silicon dioxide ($SiO_2$) layer.

6. The method according to claim 1, wherein the buffer layer is a silicon nitride ($Si_3N_4$) layer.

7. The method according to claim 1, wherein in the step of heating the amorphous silicon layer, a laser beam is used to heat and convert the amorphous silicon layer to the polysilicon layer.

8. The method according to claim 1, wherein in the step of heating the amorphous silicon layer, a laser beam is used and an excimer laser annealing (ELA) technique is applied to heat and convert the amorphous silicon layer to the polysilicon layer.

9. A method of forming a polysilicon layer on a glass substrate, applied in a TFT-LCD manufacturing process, comprising the steps of:
   doping inert gas into the glass substrate to form a plurality of pores in the glass substrate;
   depositing a buffer layer on the glass substrate;
   depositing an amorphous silicon layer on the buffer layer; and
   emitting a laser beam onto the amorphous silicon layer to convert the amorphous silicon layer into a polysilicon layer.

10. The method according to claim 9, wherein the inert gas is argon, Ar.

11. The method according to claim 9, wherein the buffer layer is a $SiO_2$ layer.

12. The method according to claim 9, wherein the buffer layer is a $Si_3N_4$ layer.

13. The method according to claim 9, wherein in the step of heating the amorphous silicon layer, an excimer laser annealing (ELA) technique is applied to heat and convert the amorphous silicon layer to the polysilicon layer.

14. A method of forming a polysilicon layer on a substrate, comprising the steps of:
   depositing a first buffer layer on a substrate;
   doping inert gas into the first buffer layer to form a plurality of pores in the first buffer layer;
   depositing a second buffer layer on the first buffer layer;
   depositing an amorphous silicon layer on the second buffer layer; and
   heating the amorphous silicon layer to convert the amorphous silicon layer into a polysilicon layer.

15. The method according to claim 14, wherein the substrate is a glass substrate.

16. The method according to claim 14, wherein the method is applied to a TFT-LCD manufacturing process.

17. The method according to claim 14, wherein the inert gas is argon, Ar.

18. The method according to claim 14, wherein the first buffer layer is a $SiO_2$ layer.

19. The method according to claim 14, wherein the first buffer layer is a $Si_3N_4$ layer.

20. The method according to claim 14, wherein the second buffer layer is a $SiO_2$ layer.

21. The method according to claim 14, wherein the second buffer layer is a $Si_3N_4$ layer.

22. The method according to claim 14, wherein in the step of heating the amorphous silicon layer, a laser beam is used to heat and convert the amorphous silicon layer to the polysilicon layer.

23. The method according to claim 14, wherein in the step of heating the amorphous silicon layer, a laser beam is used and an excimer laser annealing (ELA) technique is applied to heat and convert the amorphous silicon layer to the polysilicon layer.

24. A method of forming a polysilicon layer on a glass substrate, applied in a TFT-LCD manufacturing process, at least comprising the steps of:
   depositing a first buffer layer on a glass substrate;
   doping inert gas into the first buffer layer to form a plurality of pores in the first buffer layer;
   depositing a second buffer layer on the first buffer layer;
   depositing a amorphous silicon layer on the second buffer layer; and
   heating the amorphous silicon layer to convert the amorphous silicon layer into a polysilicon layer.

25. The method according to claim 24, wherein the inert gas is argon, Ar.

26. The method according to claim 24, wherein the first buffer layer is a $SiO_2$ layer.

27. The method according to claim 24, wherein the first buffer layer is a $Si_3N_4$ layer.

28. The method according to claim 24, wherein the second buffer layer is a $SiO_2$ layer.

29. The method according to claim 24, wherein the second buffer layer is a $Si_3N_4$ layer.

30. The method according to claim 24, wherein in the step of heating the amorphous silicon layer, an excimer laser annealing (ELA) technique is applied to heat and convert the amorphous silicon layer to the polysilicon layer.

* * * * *